United States Patent [19]
Chen et al.

[11] Patent Number: 6,011,217
[45] Date of Patent: Jan. 4, 2000

[54] CARD CARRIAGE BRACKET

[75] Inventors: Chao-Hsu Chen, Chia-I; Jen-Jou Chang, Yung-Ho; Song-Rong Chiou, Lin-Kou, all of Taiwan

[73] Assignee: Hon Hai Precision Ind. Co., Ltd., Taipei Hsien, Taiwan

[21] Appl. No.: 09/192,867

[22] Filed: Nov. 16, 1998

[30] Foreign Application Priority Data

Nov. 14, 1997 [TW] Taiwan ................................. 86219070

[51] Int. Cl.⁷ ............................................... H05K 9/00
[52] U.S. Cl. .................. 174/35 C; 439/157; 439/159; 174/35 R
[58] Field of Search ........................ 174/35 R, 35 C; 439/152–159

[56] References Cited

U.S. PATENT DOCUMENTS

| | | | |
|---|---|---|---|
| 5,026,296 | 6/1991 | Hashiguchi | 439/159 |
| 5,286,214 | 2/1994 | Takahashi | 439/159 |
| 5,421,737 | 6/1995 | Chen et al. | 439/157 |
| 5,658,162 | 8/1997 | Harting et al. | 439/372 |
| 5,795,190 | 8/1998 | Ono | 439/607 |
| 5,899,763 | 5/1999 | Kajiura | 439/159 |
| 5,906,510 | 5/1999 | Lwee | 439/541.5 |
| 5,911,589 | 6/1999 | Chen | 439/296 |

*Primary Examiner*—Kristine Kincaid
*Assistant Examiner*—Ronnie Mancho

[57] ABSTRACT

A card carriage bracket has a base. The base has a pair of supporting arms extending from transverse ends thereof. The base including the pair of supporting arms defines a receiving space therebetween. Each supporting arm forms a supporting tab extending toward the receiving space from a bottom edge thereof. At least a clip is integrally formed on one of the supporting arms. At least a first anti-disorientation device is integrally formed at an inner wall of one of the supporting arms, and a second anti-disorientation device is integrally formed at an outer wall of one of the supporting arms.

10 Claims, 5 Drawing Sheets

CARD CARRIAGE BRACKET

FIELD OF THE INVENTION

The present invention relates to a supporting bracket, and more particularly to a supporting bracket for carrying a small card therein for facilitating insertion into a standard card connector.

DESCRIPTION OF THE PRIOR ART

Conventional electrical cards are built with a tremendous amount of data which can be conveniently accessed by devices such as portable computers, mobile phones, and digital cameras. Taiwan Utility Application Nos. 82102557, 82109139, 83112259, and U.S. Pat. Nos. 5,026,296, 5,179,505, 5,197,894, and 5,421,737 disclose such techniques. However, because of the memory capacity of the card and different functions provided, the size of the electrical card varies from one to another. Basically, electrical cards can be divided into large and small cards according to their dimension. Accordingly, the mating card connectors for large and small cards are also different. If a portable computer is equipped with a large card connector, then the computer can not access data stored within a small card.

SUMMARY OF THE INVENTION

It is the objective of this invention to provide a card carriage bracket for a small card to facilitate insertion of a small card into a large card connector.

In order to achieve the objective set forth, a card carriage bracket for a small card comprises a base having a pair of supporting arms extending from transverse ends thereof and defining a receiving space therebetween. Each supporting arm forms a supporting tab extending toward the receiving space from a bottom edge thereof. At least a clip is integrally formed on one of the supporting arms. At least a first anti-disorientation device is integrally formed on an inner wall of one of the supporting arms, and a second anti-disorientation device is integrally formed on an outer wall of one of the supporting arms.

These and additional objects, features, and advantages of the present invention will become apparent after reading the following detailed description of the preferred embodiment of the invention taken in conjunction with the appended drawings.

DETAILED DESCRIPTION OF THE PREFERRED EMBODIMENT

Figure 1:
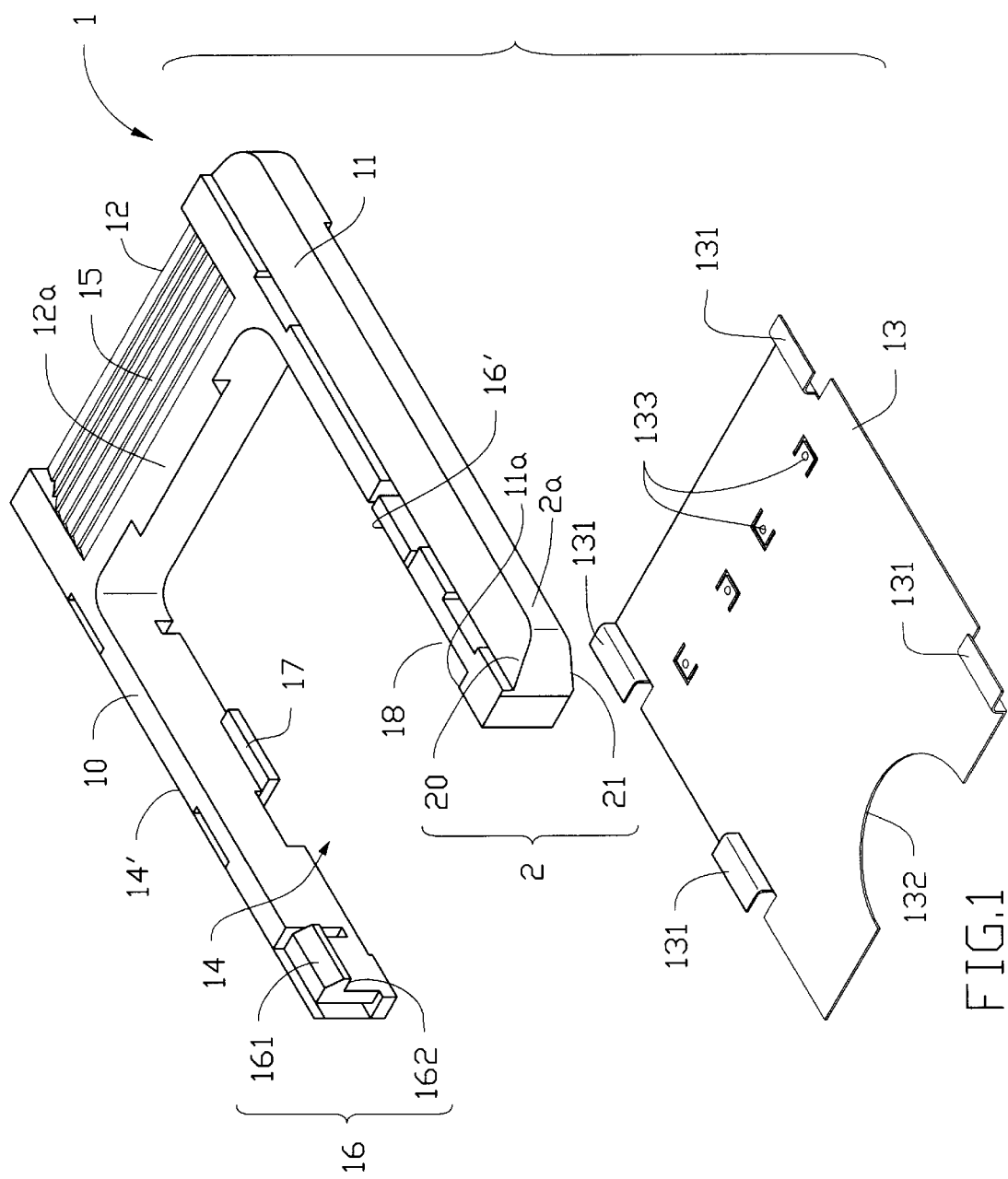
FIG. 1 is a perspective view of a card carriage bracket in accordance with the present invention.
Figure 2:
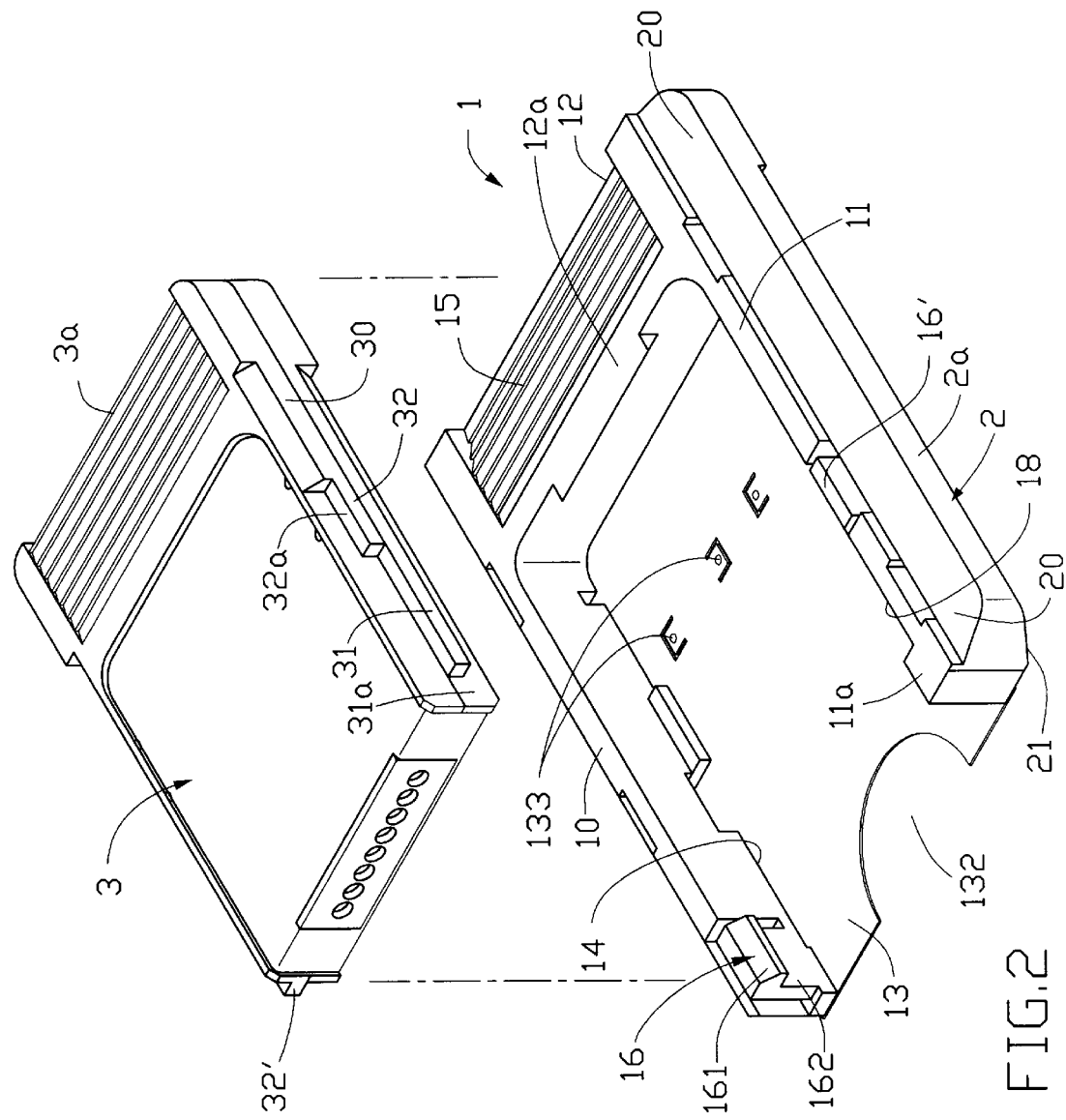
FIG. 2 is a perspective view of the card carriage bracket and a small card to be assembled therein.
Figure 3:
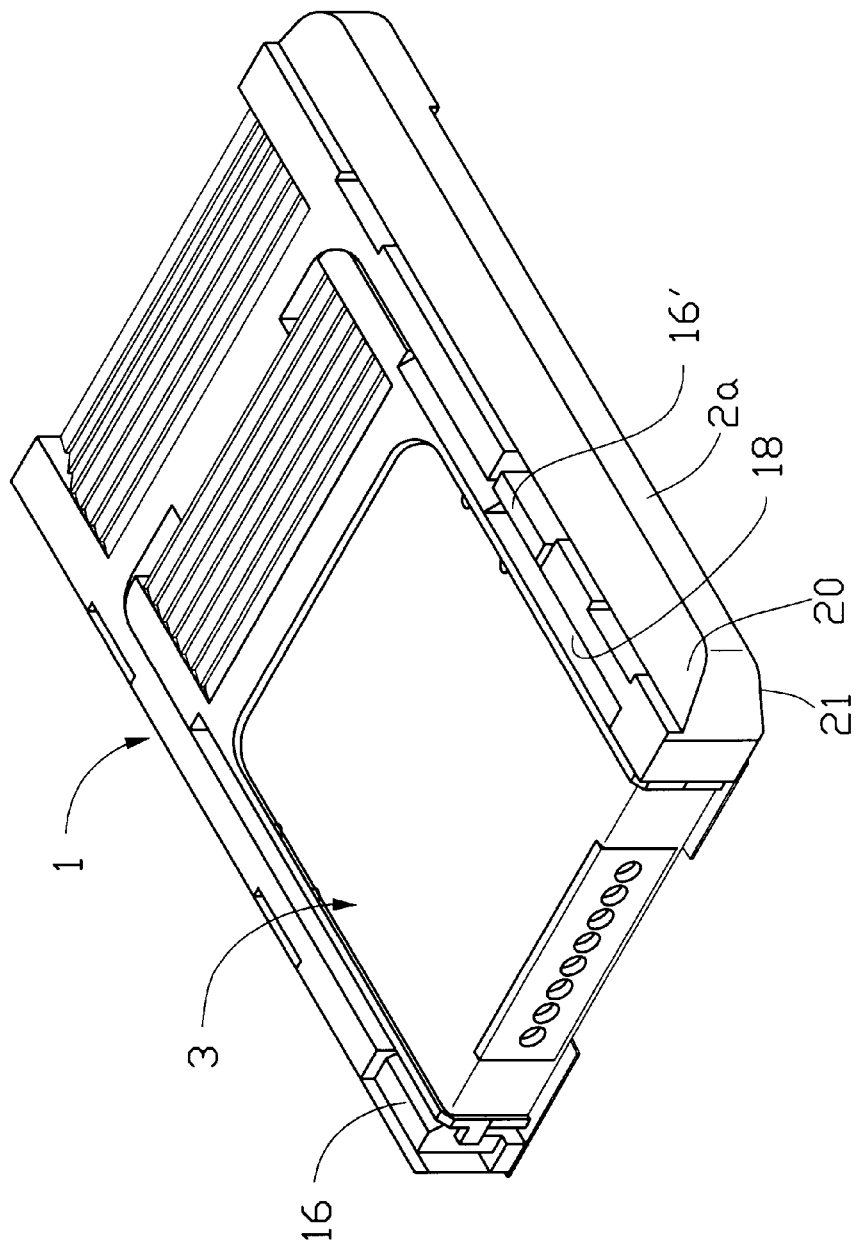
FIG. 3 is an assembled view of FIG. 2.

Referring to FIGS. 1, 2 and 3, a card carriage bracket 1 in accordance with the present invention comprises a base 12 forming a pair of supporting arms 10, 11 extending from transverse ends thereof of the base 12. A metal shield 13 is attached to a bottom of the bracket 1. The bracket 1 defines an inner receiving space 14 for a small card 3 and an outer perimeter 14'. The outer contour of the bracket 1 is same as a large electrical card. The base 12 has rugged portions 15 formed on upper and bottom surfaces thereof for facilitating grasp ablility of the bracket 1.

The supporting arm 10 forms a clip 16 at a front end thereof and the supporting arm 11 forms a clip 16' near a middle portion. The clips 16, 16' have the same configuration and only clip 16 is shown. The clip 16 forms a leading face 161 and a stopping face 162 for facilitating assembly and retention of the small card 3 therein. Each supporting arm 10 (11) further forms a supporting tab 17 extending from a bottom edge into the receiving space 14 for supporting the inserted small card 3. An inner wall 18 of the supporting arm 11 limits transverse movement of the inserted card 3. The base 12 forms a flange 12a extending toward the receiving space 14 for limiting upward movement of the inserted card 3. The supporting arm 11 forms a first anti-disorientation wedge 11a for facilitating correct insertion of the card 3.

A second anti-disorientation device 2 is integrally formed on one of the supporting arms 10 and 11. The anti-disorientation device 2 includes a ridge 2a having surfaces 20, 21 of different angles. By this arrangement, the bracket 1 can only be inserted into the large card connector 5 (FIG. 4) with the correct orientation.

The metal shield 13 forms four retaining tabs 131 for engaging bottom of the bracket 1. The metal shield 13 prevents EMI from effecting the inserted card 3. The metal shield 13 defines a cutout 132 for providing access to the inserted card 3. The metal shield 13 is integrally formed with doweling buds 133 that are directly punched from the metal shield 13. The doweling buds 133 engage with mating clips (not shown) of the inserted card 3.

The small card 3 has stepped ribs 30 integrally formed on a sidewall thereof. The stepped ribs 30 include a first rib 31 defining a space 31a at an end portion of the sidewall 11. The space 31 a and the wedge 11 a jointly prevent incorrect insertion of the small card 3. A retaining seat 32a is defined on a second rib 32 for engagement with the clip 16' of the supporting arm 11. Another retaining seat 32' is formed on the opposite sidewall of the small card 3 for engagement with the clip 16 of the supporting arm 10. By this arrangement, if the small card 3 is inserted with the incorrect orientation, the wedge 11a will block the retaining seat 32' thereby preventing insertion of the small card 3 into the receiving space 14.

Figure 4:
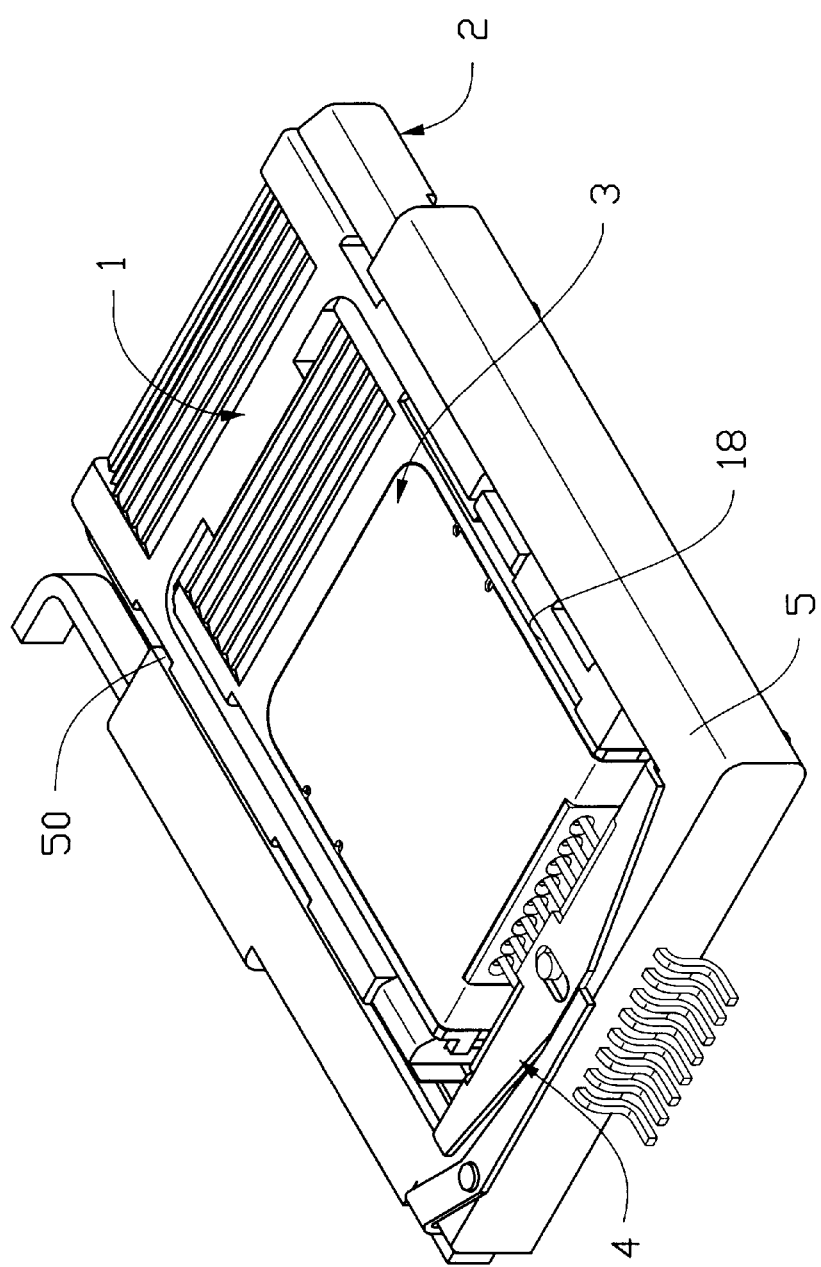
FIG. 4 is an assembled view of a large card connector in which the card carriage bracket with a small card is inserted therein.

In assembly, a head 3a of the small card 3 is firstly inserted into the receiving space 14 and located under the flange 12a. Then an under edge of the first rib 31 and an under edge of the retaining seat 32' slide over the leading face 161 of the clips 16', 16 respectively until the entire card 3 is seated in the receiving space 14, while each retaining seat 32 (32') engages with the corresponding clip 16' (16). Then the bracket 1 together with the small card 3 is inserted into a card connector 5, as shown in FIG. 4. The card connector 5 has a receiving slot 50 which ensures correct insertion of the bracket 1. The withdrawal of the bracket 1 can be easily facilitated by an ejecting mechanism 4.

Figure 5:
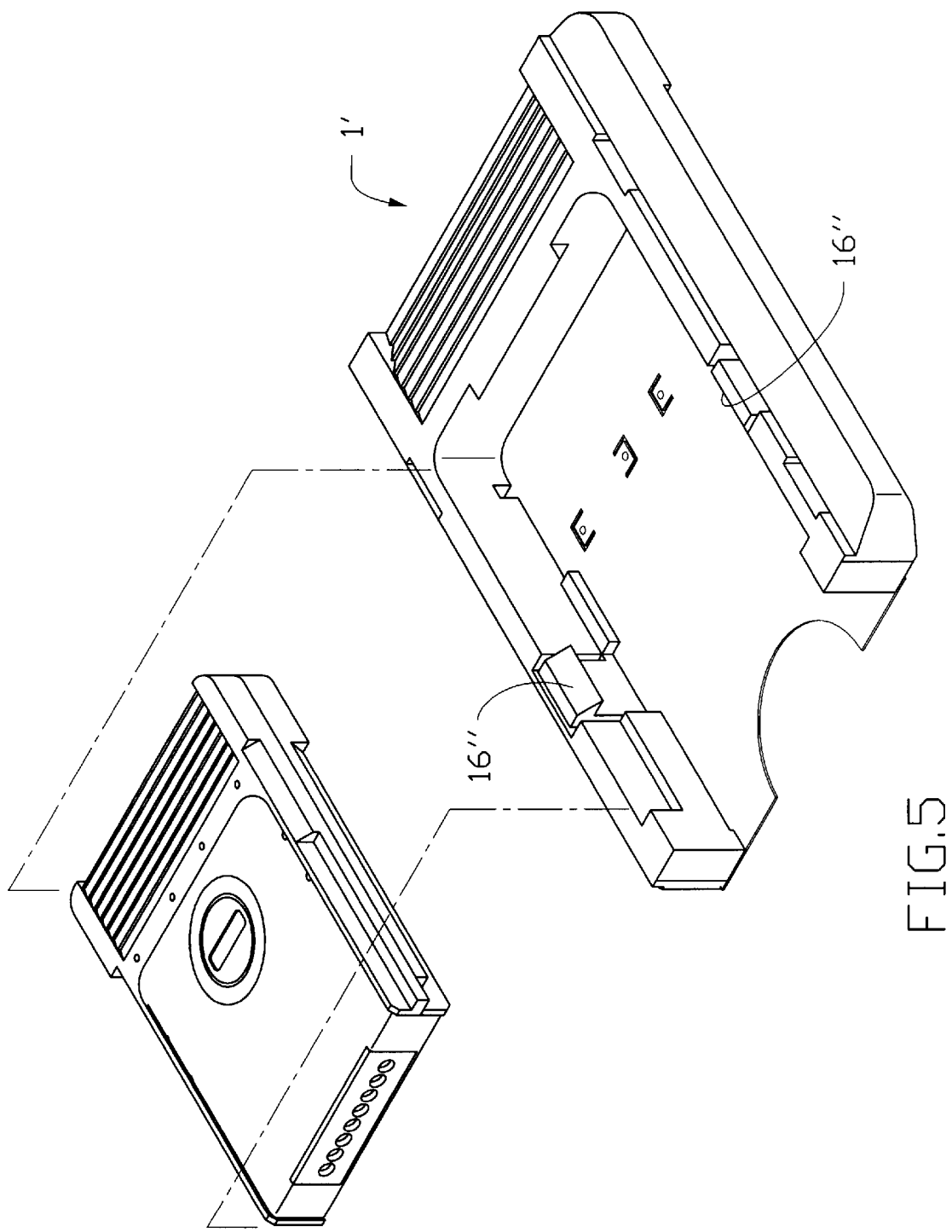
FIG. 5 is a perspective view of a card carriage bracket in accordance with a second embodiment of the present invention and a small card to be assembled therein.

FIG. 5 is a bracket 1' in accordance with a second embodiment of the present invention. The bracket 1' has a pair of clips 16– formed at the same position on opposite supporting arms. The height of the clips 16" are different thereby serving as an anti-disorientation device.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims. Therefore, persons of ordinary skill in this field are to understand that all such equivalent structures are to be included within the scope of the following claims.

We claim:

1. A card carriage bracket for use with a small card, comprising a base having a pair of supporting arms extending from transverse ends thereof and defining a receiving space therebetween, each supporting arm having a supporting tab extending toward said receiving space from a bottom edge thereof, at least a clip integrally formed on one of said supporting arms, at least a first anti-disorientation device integrally formed on an inner wall of one of said supporting arms, and a second anti-disorientation device integrally formed on an outer wall of one of said supporting arms.

2. A card carriage bracket as recited in claim 1, wherein said base has an integrally formed flange extending from a top edge into said receiving space.

3. A card carriage bracket as recited in claim 1, wherein said base has rugged portions on upper or bottom faces thereof.

4. A card carriage bracket as recited in claim 1, further comprising an EMI shield attached to a bottom of said bracket.

5. A card carriage bracket as recited in claim 1, wherein another clip is integrally formed on the other of said supporting arms.

6. A card carriage bracket as recited in claim 1, wherein said clip has a leading face and a stopping face.

7. A card carriage bracket as recited in claim 1, wherein said first anti-disorientation device is a wedge.

8. A card carriage bracket as recited in claim 1, wherein said second anti-disorientation device is a ridge integrally formed on one of said supporting arms.

9. A card carriage bracket as recited in claim 8, wherein said ridge forms first and second faces at different angles.

10. A card carriage bracket for use with a small card, comprising a base having a pair of supporting arms extending from transverse ends thereof and defining a receiving space therebetween, a clip formed on at least one supporting arm and including a leading face and a stopping face, and a first anti-disorientation device integrally formed on an inner wall of one of said supporting arms whereby the small card can be easily and correctly downwardly installed into the bracket and restrained from transversely moving.

* * * * *